(12) United States Patent
Ju et al.

(10) Patent No.: US 7,134,920 B1
(45) Date of Patent: Nov. 14, 2006

(54) ELECTRICAL MODULE CHIP CONNECTOR

(75) Inventors: Ted Ju, No. 15, Wu Shiun St., An-Lo Dist., Keelung City (TW); Wen-Chang Chang, Keelung (TW)

(73) Assignee: Ted Ju, Keelung City (TW)

( * ) Notice: Subject to any disclaimer, the term of this patent is extended or adjusted under 35 U.S.C. 154(b) by 0 days.

(21) Appl. No.: 11/287,265

(22) Filed: Nov. 28, 2005

(51) Int. Cl.
*H01R 13/15* (2006.01)

(52) U.S. Cl. ...................................... 439/691

(58) Field of Classification Search ............... 439/682, 439/331, 687, 691, 78, 83
See application file for complete search history.

(56) References Cited

U.S. PATENT DOCUMENTS

| | | | | |
|---|---|---|---|---|
| 4,346,955 A | * | 8/1982 | Chesnais et al. ............ | 439/407 |
| 4,784,623 A | * | 11/1988 | Beck, Jr. ..................... | 439/872 |
| 5,044,979 A | * | 9/1991 | Siemon et al. .............. | 439/404 |
| 5,634,829 A | * | 6/1997 | Kerul ........................... | 439/851 |
| 6,375,488 B1 | * | 4/2002 | Noro ............................ | 439/395 |
| 2001/0021609 A1 | * | 9/2001 | Chiang ........................ | 439/682 |

* cited by examiner

*Primary Examiner*—Chandrika Prasad
(74) *Attorney, Agent, or Firm*—Rosenberg, Klein & Lee

(57) ABSTRACT

An electric connector includes a base, a plurality of conductive terminals, an upper casing and a driving member for fixing and electrically connecting an electronic device on both ends of the base. The base includes a plurality of terminal containing holes for receiving a first conductive terminal and a second conductive terminal contacted said first conductive terminal. The first conductive terminal is protruded out of the containing hole for pressing and contacting the electronic device. The second conductive terminal has a solder for electrically connecting a circuit board. therefore, the conductive terminals can installed easily, and the electronic device can be electrically connected to the circuit board in a better manner.

8 Claims, 9 Drawing Sheets

ELECTRICAL MODULE CHIP CONNECTOR

BACKGROUND OF THE INVENTION

1. Field of the Invention

The present invention relates to an electric connector, and more particularly to an electric connector used for pressing and contacting a chip module.

2. Description of Related Art

Some of the present electronic products (such as computers) come with an LGA chip module, and the conductive terminals of this kind of chip modules is in the shape of a gasket, and the connector for connecting the chip module includes a terminal to be pressed and contacted by the conductive terminals. Referring to FIGS. 15 and 16 for the prior art electric connector, the connector includes an insulating body 100 and a conductive terminal 200. The insulating body 100 includes a terminal containing groove 300 for containing the conductive terminal 200. The conductive terminal 200 is integrally formed and includes a fixing section 400 for being fixed to the body 100. The fixing section 400 includes a soldering part 500 extended downward and soldered with a circuit board, and a contact section 600 extended upward to be abutted against the chip module. Although the conductive terminal has a higher conductivity, its installation is more complicated, and the terminal may be fatigued easily to produce permanent deformations which will affect the electric connection between the chip module and the circuit board. Therefore, it is necessary to design a novel electric connector to overcome the foregoing shortcomings.

In view of the foregoing shortcomings, the inventor based on years of experience in the related industry to conduct extensive researches, and finally invented a design of the present invention to feasibly and effectively improve the foregoing shortcomings.

SUMMARY OF THE INVENTION

Therefore, it is a primary objective of the present invention to provide a novel electric connector having an easy-to-install conductive terminal with an excellent exhaustion-resisting property to assure a better electric connection between an electronic device and a circuit board.

To achieve the foregoing objective, the present invention provides an electric connector of the present invention comprising an insulating body and a plurality of conductive terminals. The insulating body is formed with a plurality of terminal containing holes for receiving a first conductive terminal and a second conductive terminal. The first conductive terminal has two ends, one end is formed with a first electric connecting section for electrically coupling an external electronic device and the other end of the first conductive terminal is formed with a pressing section. The second conductive terminal has two ends, one end is formed with a second electric connecting section for electrically coupling to another external electronic device and the other end of the second conductive terminal is formed with an elastic section for elastically pressing on the pressing section.

Compared with the prior art, the electric connector of the present invention includes an easy-to-install conductive terminal that assures a better electric connection between an electronic device and a circuit board.

To make it easier for our examiner to understand the innovative features and technical content, we use embodiments together with the attached drawings for the detailed description of the invention, but it should be pointed out that the attached drawings are provided for reference and description but not for limiting the present invention.

DETAILED DESCRIPTION OF PREFERRED EMBODIMENTS

Figure 1:
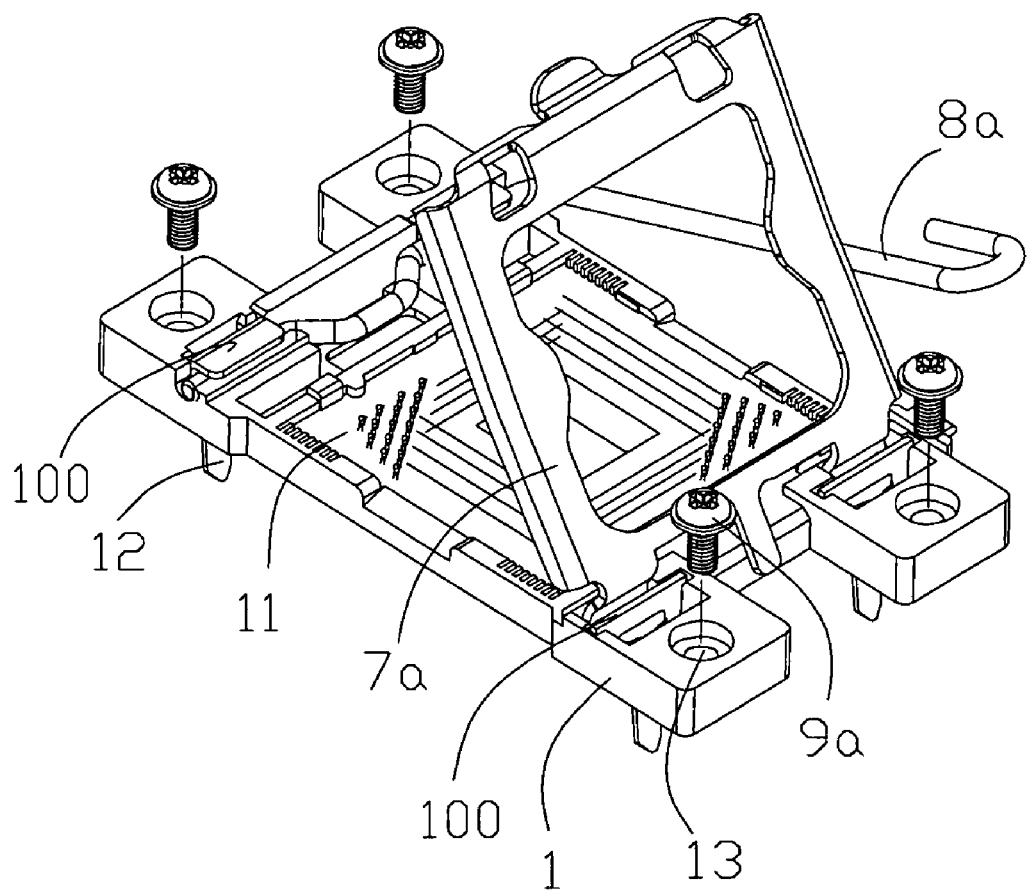
FIG. 1 is a perspective view of an electric connector of the present invention.
Figure 2:
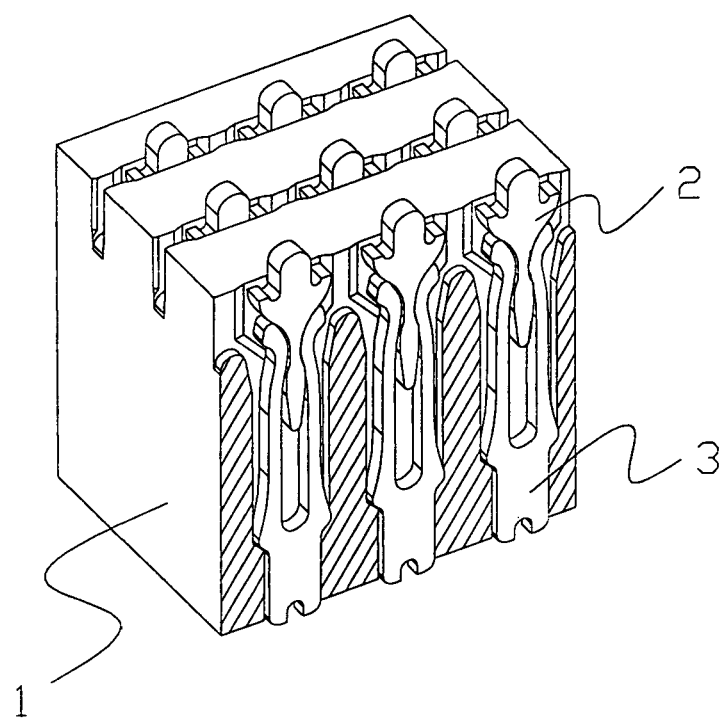
FIG. 2 is a schematic view of an electric connector of the present invention.
Figure 3:
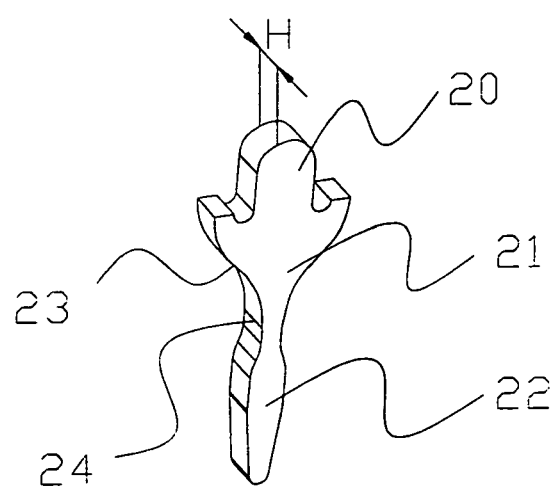
FIG. 3 is a perspective view of a first conductive terminal in an electric connector of the present invention.
Figure 4:
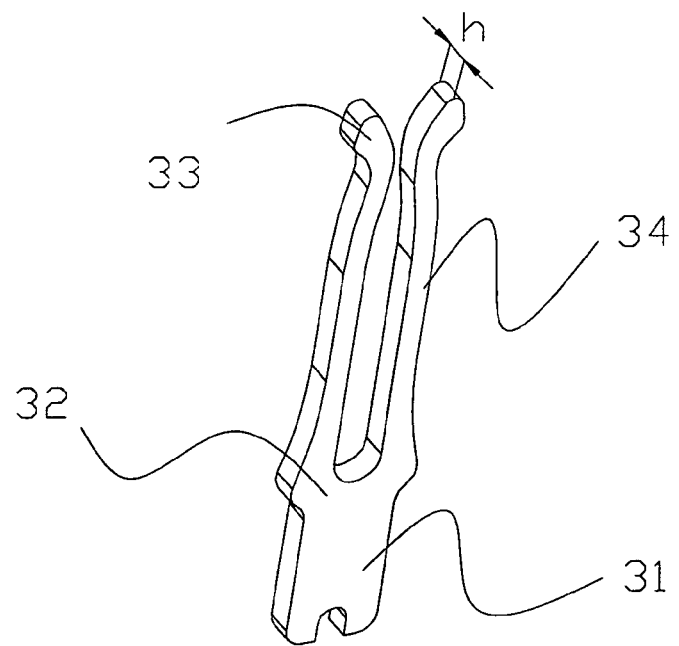
FIG. 4 is a perspective view of a second conductive terminal in an electric connector of the present invention.
Figure 5:
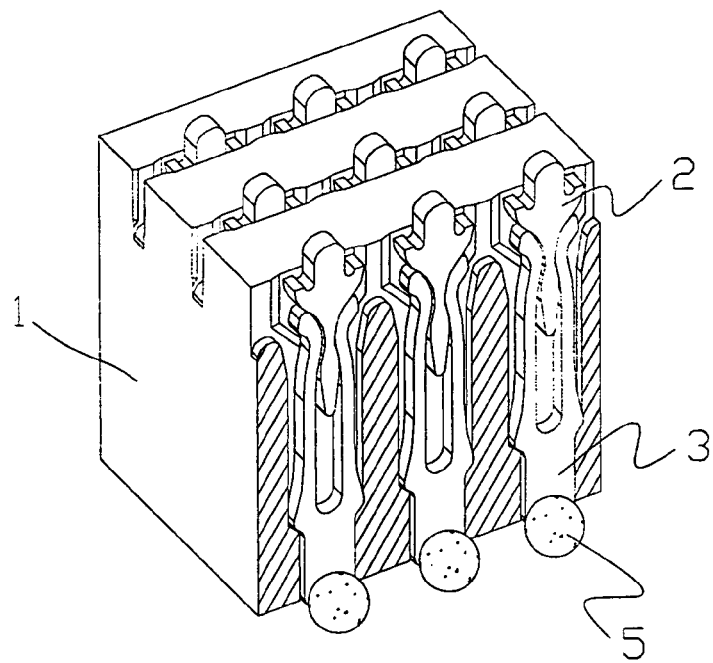
FIG. 5 is a schematic view of an electric connector having a solder ball according to the present invention.
Figure 6:
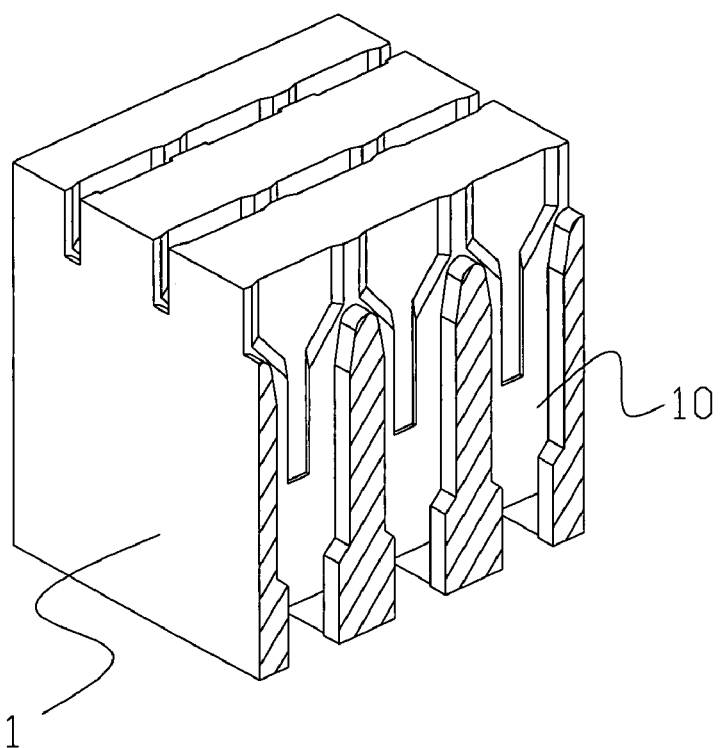
FIG. 6 is a schematic view of an insulating body of an electric connector of the present invention.

Referring to FIGS. 1 to 8, an electric connector of the present invention is used for connecting an external electronic device (which is a chip module in this embodiment and of course could be any other electronic device) to a circuit board (which is not shown in the figure and could be any other electronic device). The electric connector includes a base (which is an insulating body 1 in this embodiment), a plurality of conductive terminals, an upper casing 7a and a driving member 8a. The upper casing 7a and the driving member 8a are installed on both opposite sides of the insulating body 1 for fixing the chip module. The conductive terminal includes a first conductive terminal 2 and a second conductive terminal 3, and the electric connector further includes a connecting means 9a for fixing the insulating body 1 onto the circuit board.

The insulating body 1 forms with a plurality of holes 13 that penetrate the upper and lower surfaces of the periphery of the insulating body 1 for passing a connecting means 9a (which is a screw bolt in this embodiment), so that the insulating body 1 is fixed onto the circuit board. The insulating body 1 has a fixed body 100 for pivotally connecting the upper casing 7a to the driving member 8a. The insulating body 1 forms a sunken space 11 for containing the chip module 4. A plurality of positioning parts 12 are formed on a lower surface of the insulating body 1 for fixing the electric connector. The insulating body 1 is formed with a plurality of terminal containing holes 10 in the sunken space 11. Each containing hole 10 contains a first conductive terminal 2 and a second conductive terminal 3 connected with each other. The first conductive terminal 2 is protruded out of the containing hole 10 for pressing and contacting with the chip module. The second conductive terminal 3 has a solder ball 5. The two conductive terminals 2, 3 are able to move with respect to each other. The second conductive terminal 3 is fixed into the containing hole 10, and the first conductive terminal 2 is movably connected to the second conductive terminal 3. The first conductive terminal 2 and the second conductive terminal 3 are laminated metal, wherein the first conductive terminal 2 has a thickness H larger than a thickness h of the second conductive terminal 3.

Figure 7:
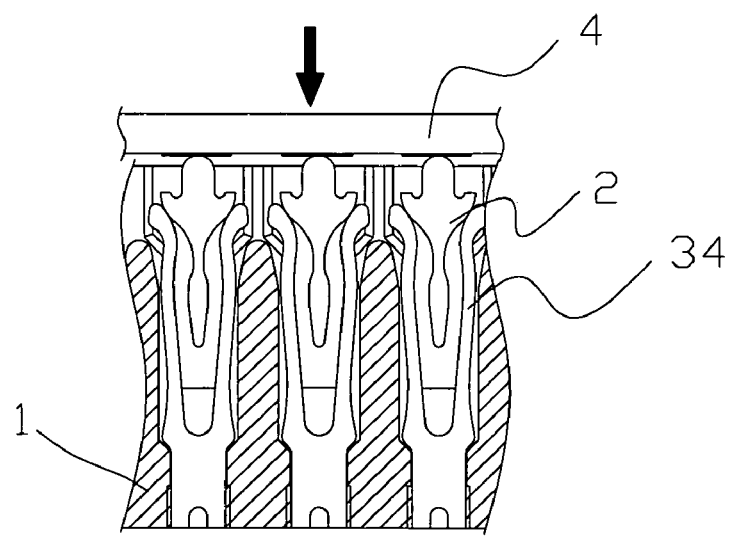
FIG. 7 is a schematic view of a chip module installed onto an electric connector according to the present invention.
Figure 8:
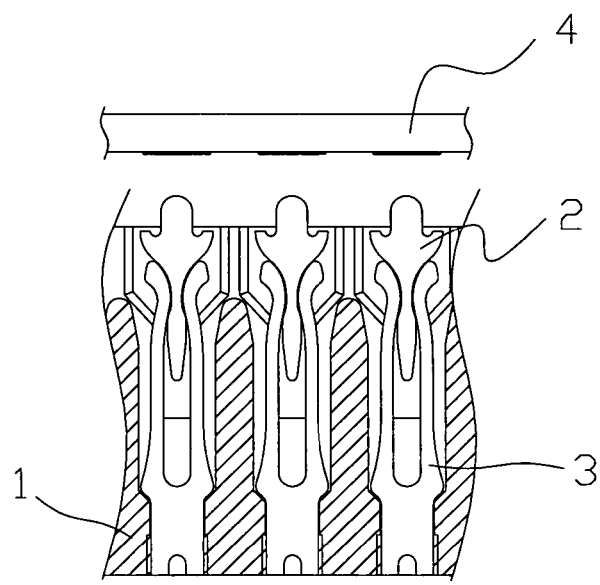
FIG. 8 is a schematic view of an electric connector before connecting to a chip module according to the present invention.

The laminated first conductive terminal 2 and the second conductive terminal 3 are parallel with each other and disposed on a same plane. An end of the first conductive terminal 2 has a protruding first electric connecting section 20, which extends into the sunken space 11 and electrically connects to the chip module. Another end of the first conductive terminal 2 forms a pressing section 21. The pressing section 21 includes two inclined surfaces 23 disposed at both ends of the lower end thereof, which incline towards an inner surface of the second conductive terminal 3. The pressing section 21 includes an inserting section 22 extended towards the second conductive terminal 3. The inserting section 22 includes a pair of grooves 24. An end of the second conductive terminal 3 forms a second electric connecting section 31 for electrically connecting to the circuit board, and another end of the second conductive terminal 3 forms an elastic section 32 for elastically abutting against the pressing section 21. The elastic section 32 includes two elastic arms 34 substantially parallel to each other. The ends of the two elastic arms 34 abut against the inclined surface 23. Two elastic arms 32 extend upward having a stopping section 33, respectively. The stopping section 33 matches with the groove 24, which forms an engagement by means of their concave and convex shape. The second electric connecting section 31 of the second conductive terminal 3 is connected with the solder ball 5 for soldering the second conductive terminal 3 onto the circuit board. Reference is made to FIGS. 7 and 8. When the chip module 4 is assembled, the first conductive terminal 2 is moved downward by a force and the inclined surfaces 23 of the conductive terminal 2 are moved to shift the elastic arm 34. If force is not applied, the elastic arm 34 will resume its original status, and the first conductive terminal 2 is bounced upward to resume its original position, so as to define a compressible electric connector.

Figure 9:
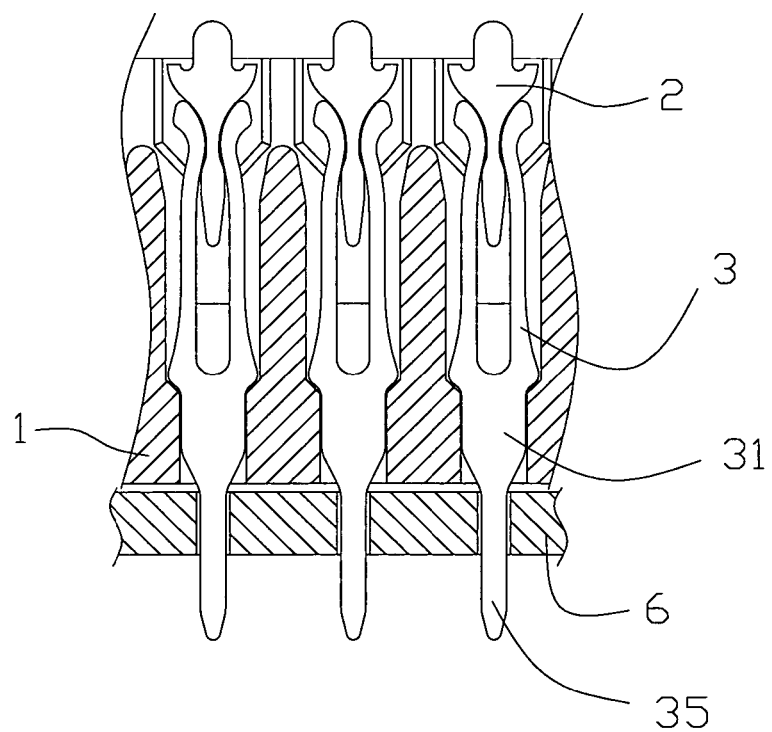
FIG. 9 is a cross-sectional view of an electric connector according to a second embodiment of the present invention.

Referring to FIG. 9, the electric connecting section 31 of the second conductive terminal 3 includes a soldering part 35 extended downward to pass through and is soldered onto the circuit board 6, and the second conductive terminal 3 could be soldered securely onto the circuit board 6.

Figure 10:
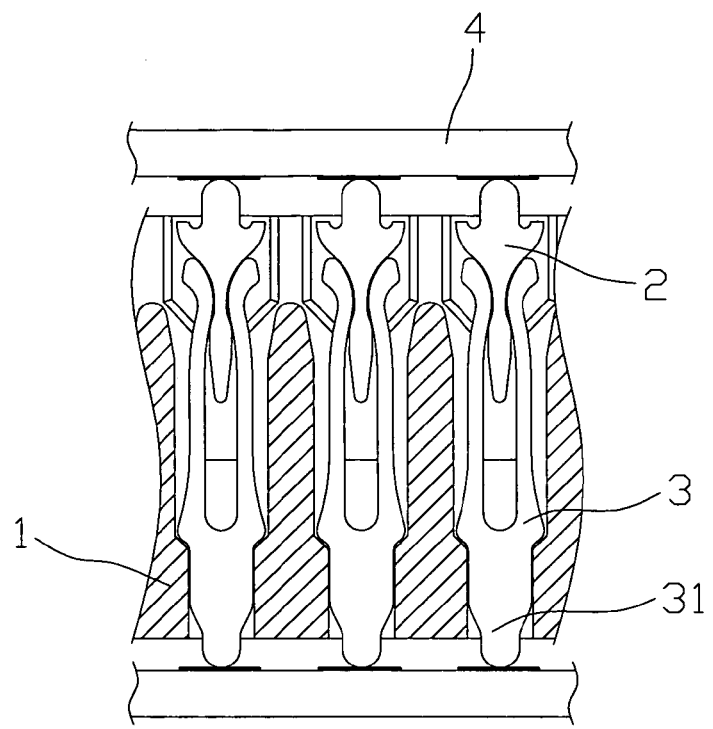
FIG. 10 is a cross-sectional view of an electric connector according to a third embodiment of the present invention.

Referring to FIG. 10 for the electric connector of a third embodiment of the present invention. The difference of this embodiment from the first embodiment resides on that the electric connecting section 31 of the second conductive terminal 3 of the third embodiment does not use a solder 5. The electric connecting section 31 of the second conductive terminal 3 of the third embodiment is protruded from the bottom of the insulating body 1 and electrically coupled with the circuit board.

Figure 11:
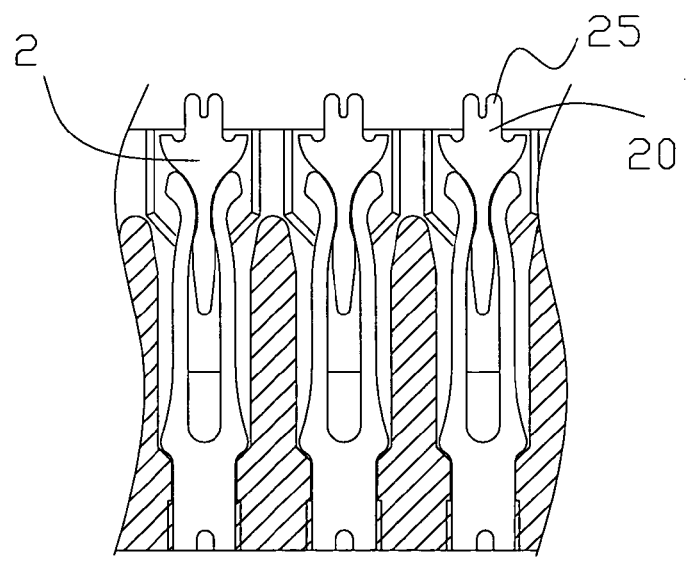
FIG. 11 is a cross-sectional view of an electric connector according to a fourth embodiment of the present invention.

Referring to FIG. 11 for the electric connector of a fourth embodiment of the present invention, its difference from the first embodiment resides on that the electric connecting section 20 of the first conductive terminal 2 of the fourth embodiment includes two contact points 25 electrically connected to the chip module.

Figure 12:
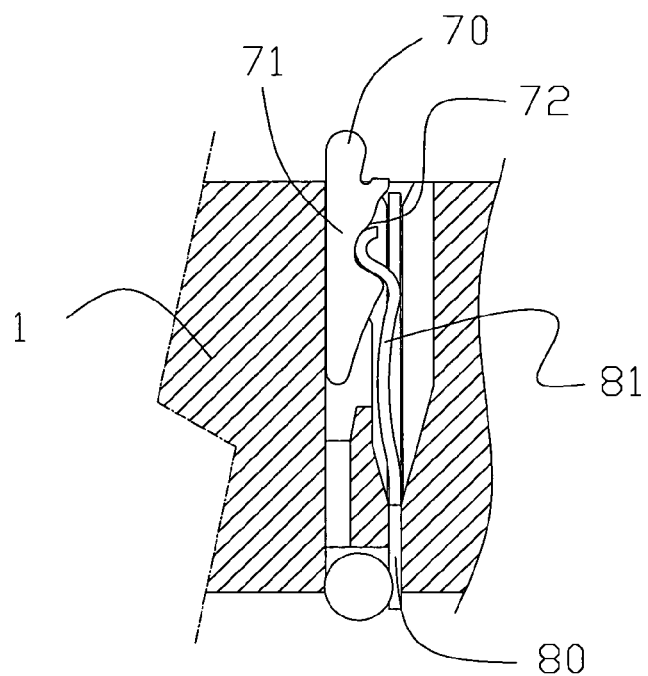
FIG. 12 is a cross-sectional view of an electric connector according to a fifth embodiment of the present invention.
Figure 13:
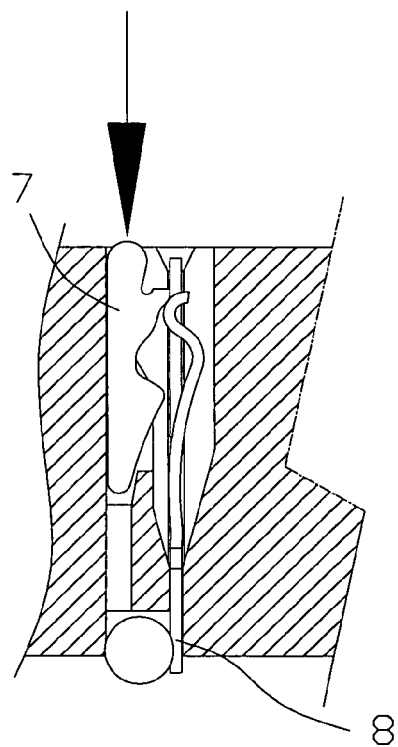
FIG. 13 is a cross-sectional view of a first conductive terminal of an electric connector as shown in FIG. 12 being pressed down according to the present invention.

Referring to FIGS. 12 and 13 for the electric connector of a fifth embodiment of the present invention, its difference from the first embodiment resides on that a laminated first conductive terminal 7 and a second conductive terminal 8 of the fifth embodiment are perpendicular with each other. An end of the first conductive terminal 7 forms a first electric connecting section 70 electrically connected to the chip module, and the other end of the first conductive terminal 7 forms a pressing section 71. The pressing section 71 has two sides, one side formed with an inclined surface 72 that is inclined towards the second conductive terminal 8 and outward. An end of the second conductive terminal 8 forms a second electric connecting section 80 electrically connected to the circuit board, and another end of the second electric connecting section 80 forms an elastic section elastically pressing onto the pressing section 71. The elastic section includes an elastic arm 81 having an upper plane substantially perpendicular to a lower plane of the pressing section 71. The inclined surface 72 is pressed and supported by the elastic arm 81. The other side of the pressing section 71 presses against the insulating body 1, so as to produce a compressible contact electric connector like the first embodiment.

Figure 14:
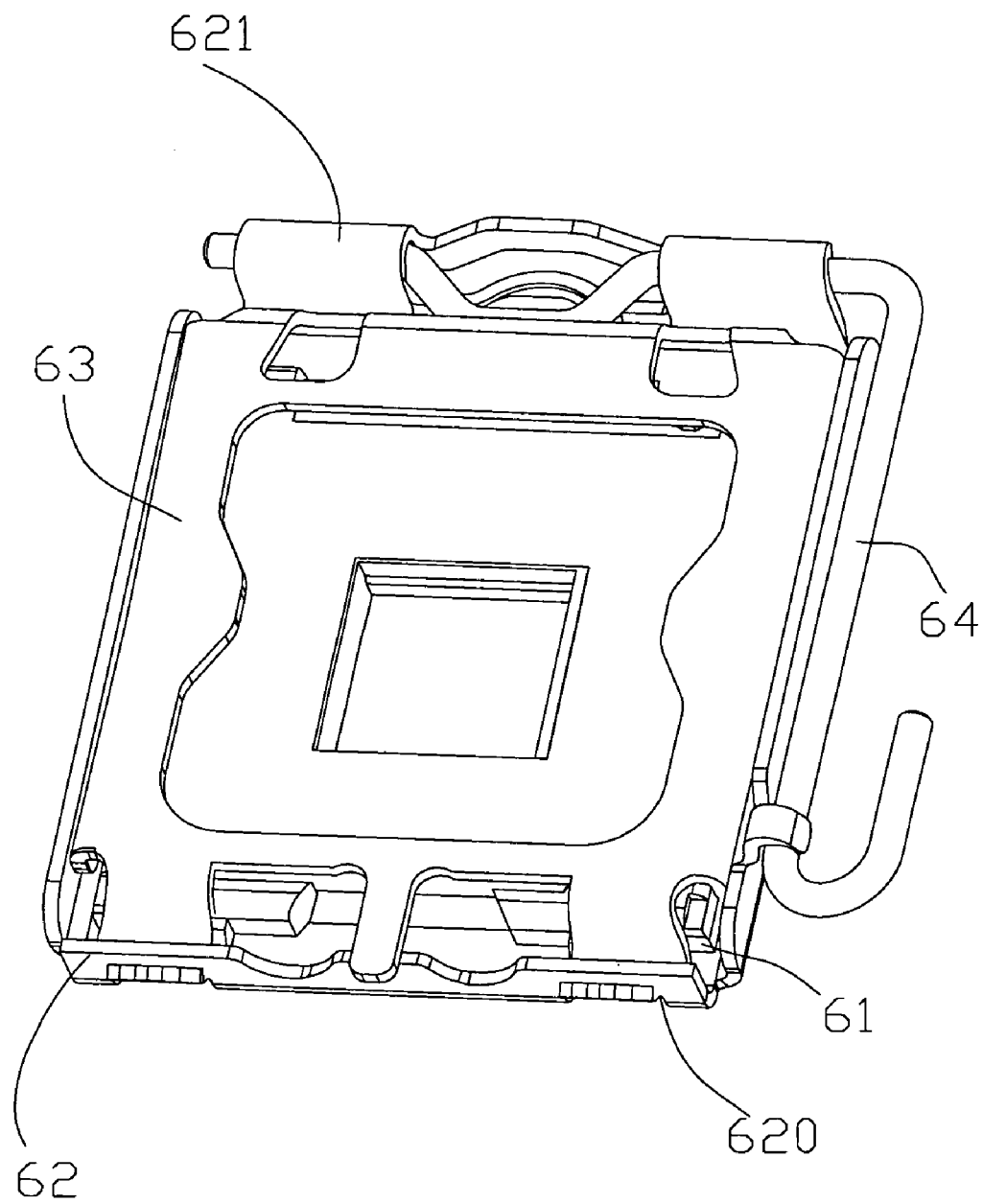
FIG. 14 is a perspective view of an electric connector according to a sixth embodiment of the present invention.
Figure 15:
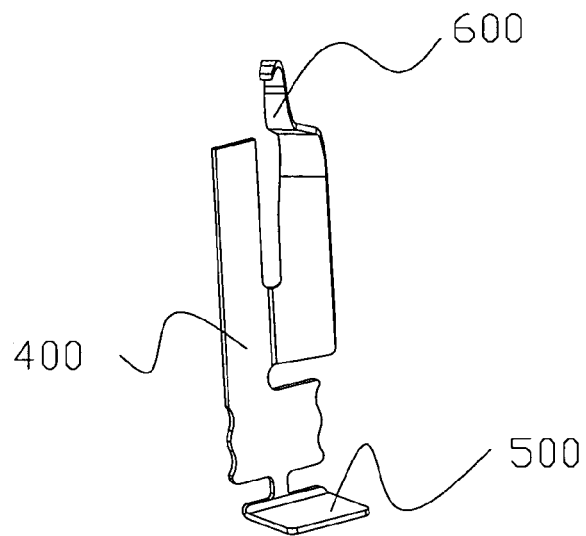
FIG. 15 is a perspective view of a prior art terminal.
Figure 16:
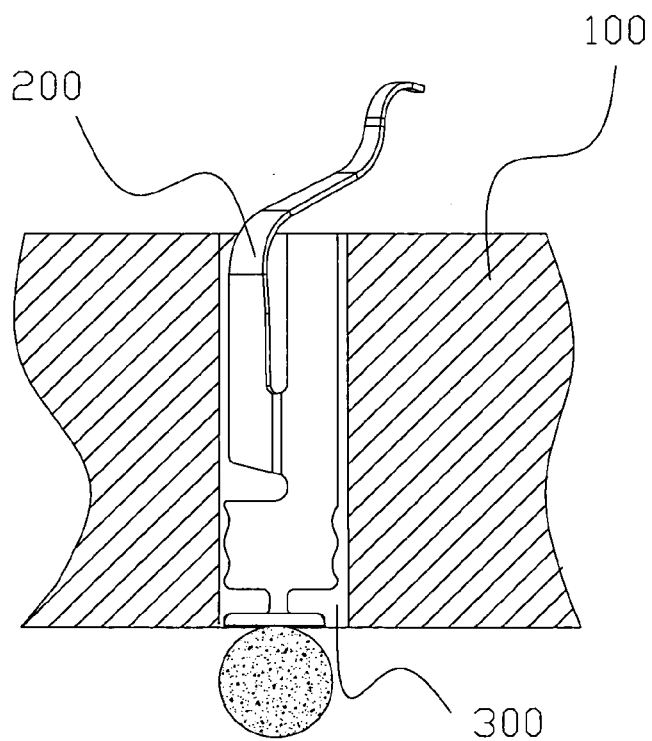
FIG. 16 is a cross-sectional view of a section of the prior art.

Referring to FIG. 14 for the electric connector of a sixth embodiment of the invention, its difference from the first embodiment resides on that the base of the sixth embodiment includes an insulating body 61, a lower casing 62 connected to the insulating body 61, an upper casing 63, and a driving member 64 respectively and pivotally coupled to both ends of the lower casing 62. An end of the lower casing 62 includes a pair of pivotal connecting hole 620 pivotally connected to the upper casing 63, and another end of the lower casing 62 includes a pair of pivotal connecting section 621 of the driving member 64, so as to achieve the effects of the foregoing embodiment.

Although the present invention has been described with reference to the embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An electric connector, comprising:
    an insulating body; and
    a plurality of conductive terminals;
        said insulating body formed with a plurality of terminal containing holes for receiving a first conductive terminal and second conductive terminal contacting said first conductive terminal, said first conductive terminal having two ends, one end formed with a first electric connecting section for electrically coupling to an external electronic device and the other end of said first conductive terminal formed with a pressing section, said second conductive terminal having two ends, one end formed with a second electric connecting section for electrically coupling to another external electronic device and the other end of said second conductive terminal formed with an elastic section for elastically pressing on said pressing section;

wherein a lower end of said pressing section of said first conductive terminal respectively forms a pair of inclined surfaces that abut against an inner surface of said second conductive terminal and said second conductive terminal further including two elastic arms opposite to each other which extend from said elastic section in the same plane, and a pair of end sections of said two elastic arms abutting said inclined surfaces;

wherein each of said elastic arms further include a stopping section protruding from an upper end thereof, said pressing section of said first conductive terminal having an inserting section which extends towards said second conductive terminal, and said first conductive terminal further having a groove formed between said inserting section and said pressing section for matching with said stopping section.

2. The electric connector of claim 1, wherein said first conductive terminal and said second conductive terminal are in a laminated shape.

3. The electric connector of claim 1, wherein said first conductive terminal has a thickness larger than that of said second conductive terminal.

4. The electric connector of claim 1, wherein said insulating body includes a sunken space, and said first electric connecting section protrudes from a lower surface of said sunken space.

5. The electric connector of claim 1, wherein said first conductive terminal and said second conductive terminal are perpendicular to each other, and said pressing section of said first conductive terminal has two sides, one side being formed with a pair of inclined surfaces that abut against an inner surface of said second conductive terminal, and said elastic section of said second conductive terminal includes a pair of elastic arms, said elastic arms having an upper plane that are substantially perpendicular to a lower plane of said pressing section, and said inclined surfaces being supported by said elastic arms of said second conductive terminal, and the other side of said pressing section of said first conducting terminal abuts against said insulating body.

6. The electric connector of claim 1, wherein said first conductive terminal and said second conductive terminal are parallel with each other and disposed in one plane each with respect to each other.

7. The electric connector of claim 1, wherein said electric connecting section of said first conductive terminal forms two contact points.

8. The electric connector of claim 1, wherein said electric connecting section of said second conductive terminal has a solder ball.

* * * * *